US012811571B2

(12) United States Patent
Hsu et al.

(10) Patent No.: US 12,811,571 B2
(45) Date of Patent: Nov. 24, 2026

(54) ADAPTIVE ADJUSTABLE SPREAD SPECTRUM CONTROL CIRCUIT AND SPREAD SPECTRUM CONTROL METHOD THEREOF

(71) Applicant: Richtek Technology Corporation, Zhubei City (TW)

(72) Inventors: Chen-Lin Hsu, Taoyuan (TW); Chia-Chun Lee, Yunlin (TW)

(73) Assignee: RICHTEK TECHNOLOGY CORPORATION, Zhubei City (TW)

( * ) Notice: Subject to any disclaimer, the term of this patent is extended or adjusted under 35 U.S.C. 154(b) by 0 days.

(21) Appl. No.: 18/939,675

(22) Filed: Nov. 7, 2024

(65) Prior Publication Data

US 2025/0373231 A1 Dec. 4, 2025

Related U.S. Application Data

(60) Provisional application No. 63/655,163, filed on Jun. 3, 2024.

(30) Foreign Application Priority Data

Sep. 24, 2024 (TW) ................................ 113136104

(51) Int. Cl.
*H03K 3/012* (2006.01)
*H03K 3/017* (2006.01)

(52) U.S. Cl.
CPC ............. *H03K 3/012* (2013.01); *H03K 3/017* (2013.01)

(58) Field of Classification Search
CPC .......... H03K 3/01; H03K 3/011; H03K 3/012; H03K 3/017; H03K 7/08; H02M 7/525; H02M 7/527; H02M 7/7395; H02M 3/158; H02M 1/44
See application file for complete search history.

(56) References Cited

U.S. PATENT DOCUMENTS

| | | | | |
|---|---|---|---|---|
| 2009/0218999 | A1* | 9/2009 | Kikuchi ................ | H02M 3/156 323/282 |
| 2021/0376715 | A1 | 12/2021 | Madala et al. | |
| 2021/0391790 | A1* | 12/2021 | Lee ......................... | H04B 1/69 |

FOREIGN PATENT DOCUMENTS

| | | |
|---|---|---|
| CN | 117277799 A | 12/2023 |

* cited by examiner

*Primary Examiner* — Long Nguyen
(74) *Attorney, Agent, or Firm* — Tung & Associates

(57) ABSTRACT

A spread spectrum control circuit generates a pulse-width modulation (PWM) signal with a switching frequency to control a switching power converter. The switching power converter includes a power stage, which includes an inductor and at least one switch coupled to each other, and the at least one switch is controlled by the PWM signal to convert an input voltage to an output voltage. The spread spectrum control circuit includes: a spread spectrum adjustment circuit, for generating a spread spectrum adjustment signal based on operating parameters of the switching power converter, thereby controlling the switching frequency exhibiting spread spectrum characteristics; and a PWM circuit, for adaptively adjusting a spread spectrum adjustment parameter of the spread spectrum characteristic according to the spread spectrum adjustment signal, such that the spread spectrum adjustment parameter are adaptively adjusted with the changes in the operating parameters, thereby generating the PWM signal exhibiting spread spectrum characteristics.

16 Claims, 16 Drawing Sheets

ADAPTIVE ADJUSTABLE SPREAD SPECTRUM CONTROL CIRCUIT AND SPREAD SPECTRUM CONTROL METHOD THEREOF

CROSS REFERENCE

The present invention claims priority to the provisional application Ser. No. 63/655,163, filed on Jun. 3, 2024 and claims priority to the TW patent application No. 113136104, filed on Sep. 24, 2024.

BACKGROUND OF THE INVENTION

Field of Invention

The present invention relates to a spread spectrum control circuit, particularly to an adaptively adjustable spread spectrum control circuit. The present invention also relates to a control method for the aforementioned spread spectrum control circuit.

Description of Related Art

FIG. 1 shows a prior art switching power converter. As shown in FIG. 1, the switching power converter 90 includes a power stage circuit 91 and a spread spectrum control circuit 92. The controllable oscillator 921 of the spread spectrum control circuit 92 generates a clock signal CLK with spread spectrum based on a spread spectrum control signal SSP. The pulse-width modulation (PWM) circuit 922 generates control signals HG and LG based on a feedback signal VFB and the clock signal CLK to control the switches Q1 and Q2 of the power stage circuit 91, thereby converting an input voltage VIN to generate an output voltage VOUT.

A drawback of the prior art is that the spread spectrum control signal SSP has a fixed spread spectrum variation range, meaning that the frequency spectrum is spread to the same range regardless of the level of electromagnetic interference (EMI) caused by the switching power converter. While spread spectrum control can reduce EMI, it also results in larger ripple in the output voltage and current as well as increased power loss.

SUMMARY OF THE INVENTION

From one perspective, the present invention provides a spread spectrum control circuit for generating a pulse-width modulation (PWM) signal switched at a switching frequency to control a switching power converter. The switching power converter includes a power stage circuit, which includes an inductor and at least one power switch coupled to each other, and is configured to switch the at least one power switch according to the PWM signal to convert an input voltage into an output voltage. The spread spectrum control circuit comprises: a spread spectrum adjustment circuit, configured to generate a spread spectrum adjustment signal based on an operating parameter of the switching power converter, thereby controlling the switching frequency exhibiting spread spectrum characteristics; and a PWM circuit, configured to adaptively adjust a spread spectrum adjustment parameter of the spread spectrum characteristic based on the spread spectrum adjustment signal, so that the spread spectrum adjustment parameter is adaptively adjusted with changes in the operating parameter, thereby generating the PWM signal exhibiting spread spectrum characteristics.

In one preferred embodiment, the spread spectrum control circuit further comprises: an oscillator, configured to generate a base clock signal; and a spread spectrum modulation circuit, configured to generate a spread spectrum clock signal exhibiting spread spectrum characteristics based on the base clock signal and the spread spectrum adjustment signal; wherein the PWM circuit is further configured to generate the PWM signal exhibiting spread spectrum characteristics based on the spread spectrum clock signal.

In one preferred embodiment, the spread spectrum adjustment parameter of the spread spectrum characteristic includes a spread spectrum variation range of the switching frequency.

In one preferred embodiment, the operating parameters include: an inductor current-related signal, the switching frequency, and/or a relationship between the input voltage and the output voltage, wherein the inductor current-related signal is related to an inductor current flowing through the inductor.

In one preferred embodiment, the at least one power switch includes a first switch and a second switch, wherein the inductor current-related signal includes a first switch current flowing through the first switch and/or a second switch current flowing through the second switch.

In one preferred embodiment, the relationship between the input voltage and the output voltage includes at least one of the following: a ratio of the input voltage to the output voltage; or a ratio of the output voltage to the input voltage.

In one preferred embodiment, the spread spectrum variation range is positively correlated with the inductor current-related signal, the switching frequency, and/or the relationship between the input voltage and the output voltage.

In one preferred embodiment, the power stage circuit is configured as a buck power stage circuit, wherein the spread spectrum variation range is positively correlated with the ratio of the input voltage to the output voltage.

In one preferred embodiment, the spread spectrum adjustment circuit is further configured to generate the spread spectrum adjustment signal based on a comparison between the operating parameter and at least one threshold, thereby adjusting the spread spectrum adjustment parameter.

In one preferred embodiment, the operation of the spread spectrum adjustment circuit further includes at least one of the following: determining an initial value of the spread spectrum variation range based on a comparison between the switching frequency and a first operating parameter threshold; adjusting the spread spectrum variation range based on a comparison between the relationship of the input voltage to the output voltage and a second operating parameter threshold; and/or adjusting the spread spectrum variation range based on a comparison between the inductor current-related signal and a third operating parameter threshold.

In one preferred embodiment, the operation of the spread spectrum adjustment circuit further includes at least one of the following: setting the spread spectrum variation range to a first initial value when the switching frequency is greater than a frequency threshold, and otherwise setting the spread spectrum variation range to a second initial value; adding a first adjustment value to the spread spectrum variation range when the ratio of the input voltage to the output voltage exceeds a ratio threshold, and otherwise adding a second adjustment value to the spread spectrum variation range; and/or adding a third adjustment value to the spread spectrum variation range when the level of the inductor current-related signal exceeds a current level threshold, and otherwise adding a fourth adjustment value to the spread spectrum variation range; wherein the first initial value is greater than the second initial value, the first adjustment value is greater than the second adjustment value, and/or the third adjustment value is greater than the fourth adjustment value.

In one preferred embodiment, the first adjustment value is equal to the third adjustment value, the second adjustment value is 0 to maintain the spread spectrum variation range, and/or the fourth adjustment value is 0 to maintain the spread spectrum variation range.

From another perspective, the present invention provides a spread spectrum control method for generating a PWM signal switched at a switching frequency to control a switching power converter. The switching power converter includes a power stage circuit, which includes an inductor and at least one power switch coupled to each other, and is configured to switch the at least one power switch according to the PWM signal to convert an input voltage into an output voltage. The spread spectrum control method comprises: obtaining an operating parameter of the switching power converter; generating a spread spectrum adjustment signal based on the operating parameter; controlling the switching frequency exhibiting spread spectrum characteristics based on the spread spectrum adjustment signal; and adaptively adjusting a spread spectrum adjustment parameter of the spread spectrum characteristic based on the spread spectrum adjustment signal, so that the spread spectrum adjustment parameter is adaptively adjusted with changes in the operating parameter, thereby generating the PWM signal exhibiting spread spectrum characteristics.

The present invention proposes an adaptively adjustable spread spectrum control circuit. The spread spectrum control circuit of the present invention can adaptively adjust the spread spectrum variation range based on the level of electromagnetic interference. Specifically, the spread spectrum control circuit of the present invention can adjust the spread spectrum variation range adaptively based on the switching frequency, input voltage, output voltage, and signals related to the inductor current, thereby reducing unnecessary power loss and mitigating output ripple to improve the efficiency and performance of power conversion.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
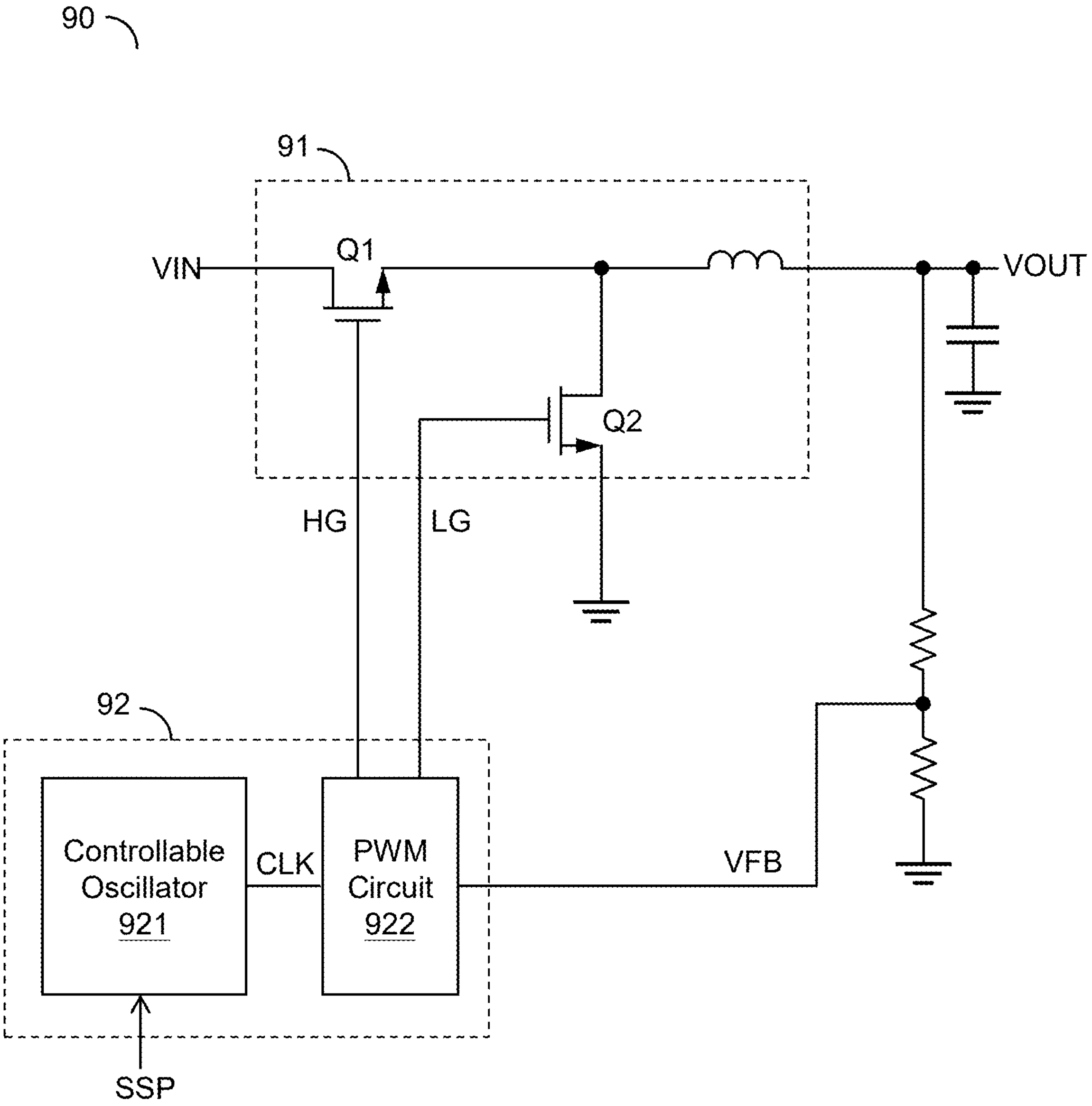
Fig. 1 (Prior Art)
FIG. 1 shows a prior art switching power converter.
Figure 2:
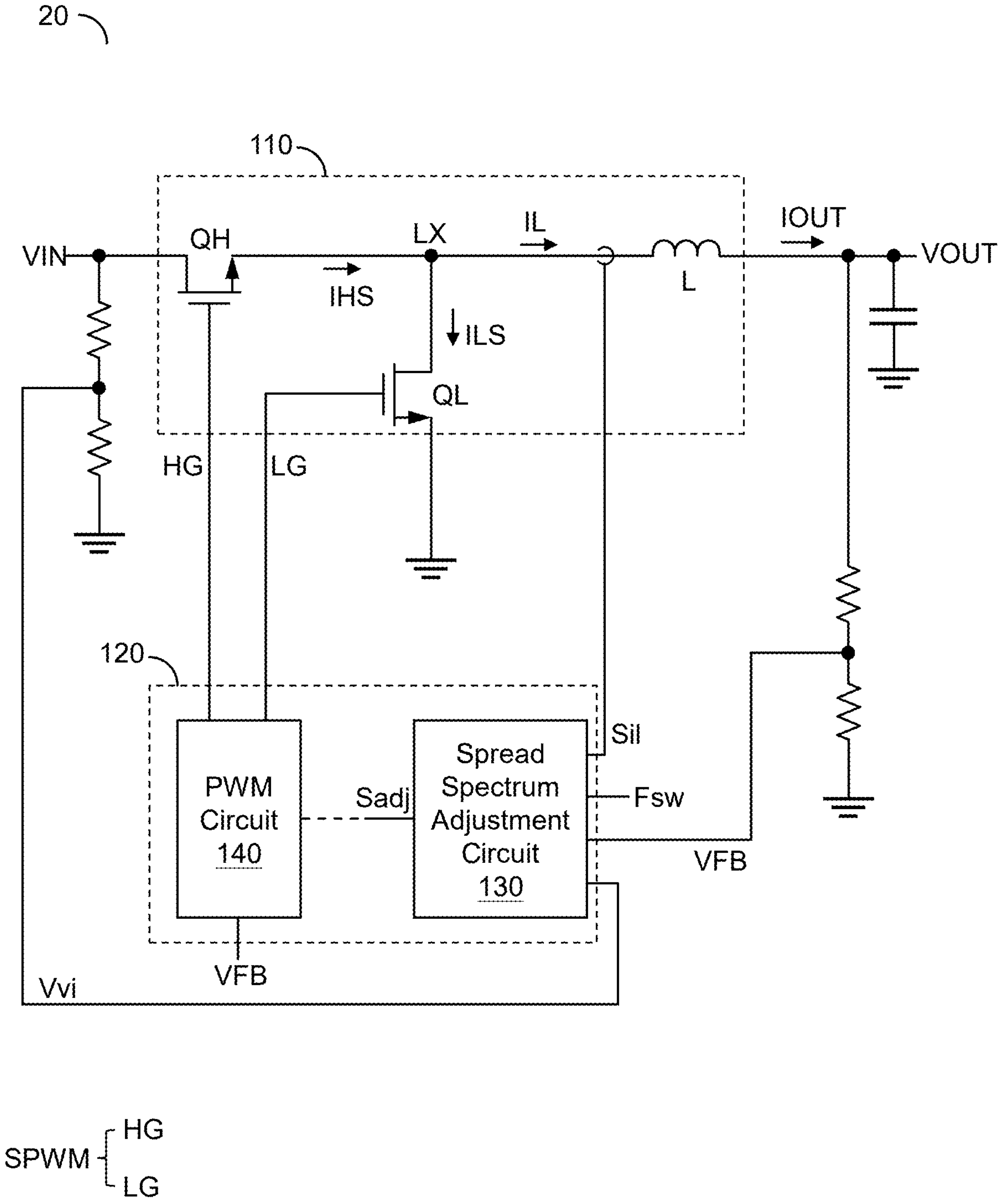
FIG. 2 shows a schematic diagram of a switching power converter according to an embodiment of the present invention.

FIG. 2 shows a schematic diagram of a switching power converter according to an embodiment of the present invention. In one embodiment, the spread spectrum control circuit 120 is configured to generate a pulse-width modulation (PWM) signal SPWM based on a switching frequency Fsw to control the switching power converter 20. The switching power converter 20 includes a power stage circuit 110, which includes an inductor L and at least one power switch coupled at a switching node LX. The power stage circuit 110 is configured to switch the at least one power switch according to the PWM signal SPWM to convert an input voltage VIN into an output voltage VOUT. In this embodiment, the at least one power switch includes a first switch QH and a second switch QL, and the PWM signal SPWM includes control signals HG and LG, which are configured to control the first switch QH and the second switch QL, respectively. In this embodiment, the first switch QH (as a high-side switch), and the second switch QL (as a low-side switch), in conjunction with the inductor L, form a buck power stage circuit.

In one embodiment, as shown in FIG. 2, the spread spectrum control circuit 120 includes a spread spectrum adjustment circuit 130 and a PWM circuit 140. In one embodiment, the spread spectrum adjustment circuit 130 is configured to generate a spread spectrum adjustment signal Sadj based on the operating parameters of the switching power converter 20, thereby controlling the switching frequency Fsw exhibiting spread spectrum characteristics. The PWM circuit 140 is configured to adaptively adjust a spread spectrum adjustment parameter of the spread spectrum characteristic based on the spread spectrum adjustment signal Sadj, such that the spread spectrum adjustment parameter is adaptively adjusted with changes in the operating parameters, thereby generating the PWM signal SPWM exhibiting spread spectrum characteristics. In one embodiment, the spread spectrum adjustment parameter of the spread spectrum characteristic includes a spread spectrum variation range $\Delta f$ of the switching frequency Fsw. Specifically, the spread spectrum variation range $\Delta f$ represents the extent range of spectrum spreading. In one embodiment, the spread spectrum characteristic is achieved by varying the frequency within the spread spectrum variation range $\Delta f$ around the switching frequency Fsw in a structured or random manner. Structured methods include for example linearly varying the frequency using a triangular or sawtooth waveform. In one embodiment, the frequency variation can also be controlled by combining structured and random methods.

In one embodiment, the operating parameters include: an inductor current-related signal Sil, the switching frequency Fsw, and/or a relationship between the input voltage VIN and the output voltage VOUT. In this embodiment, the inductor current-related signal Sil is obtained by sensing the inductor current IL flowing through the inductor L. Thus, the inductor current-related signal Sil is positively correlated with the inductor current IL. In this embodiment, the relationship between the input voltage VIN and the output voltage VOUT is obtained from an input-related signal Vvi and a feedback signal VFB.

According to the aforementioned spread spectrum adjustment parameter (such as the spread spectrum variation range Δf) being adaptively adjusted with changes in the operating parameters, an exemplary embodiment is as follows: the spread spectrum variation range Δf is positively correlated with the inductor current-related signal Sil, the switching frequency Fsw, and/or the relationship between the input voltage VIN and the output voltage VOUT.

In one embodiment, the relationship between the input voltage VIN and the output voltage VOUT includes at least one of the following: the ratio of the input voltage VIN to the output voltage VOUT (VIN/VOUT); or the ratio of the output voltage VOUT to the input voltage VIN (VOUT/VIN). In one embodiment, as shown in FIG. 2, the power stage circuit 110 is configured as a buck power stage circuit, in which the spread spectrum variation range Δf is positively correlated with the ratio of the input voltage VIN to the output voltage VOUT. It should be noted that in a buck power stage circuit, a higher ratio of the input voltage VIN to the output voltage VOUT corresponds to a lower duty cycle for the power stage circuit (particularly with respect to the high-side switch).

Figure 3:
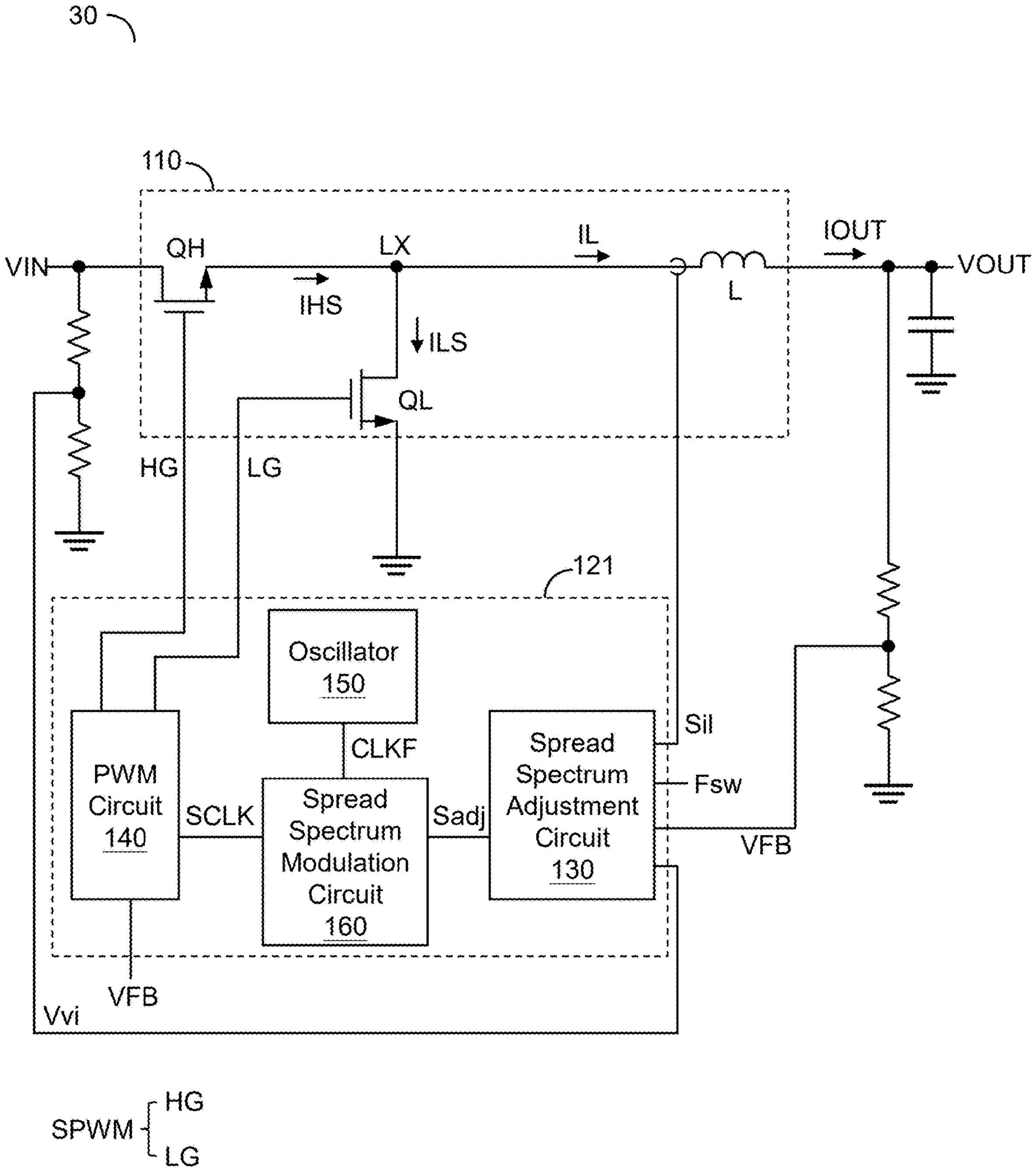
FIG. 3 shows a schematic diagram of a switching power converter according to an embodiment of the present invention.

FIG. 3 shows a schematic diagram of a switching power converter according to an embodiment of the present invention. The switching power converter 30 in FIG. 3 is a more specific embodiment similar to the one shown in FIG. 2. In this embodiment, the spread spectrum control circuit 121 further includes an oscillator 150 and a spread spectrum modulation circuit 160. In one embodiment, the oscillator 150 is configured to generate a base clock signal CLKF. The spread spectrum modulation circuit 160 is configured to generate a spread spectrum clock signal SCLK exhibiting spread spectrum characteristics based on the base clock signal CLKF and the spread spectrum adjustment signal Sadj. In this embodiment, the PWM circuit 140 is further configured to generate the PWM signal SPWM exhibiting spread spectrum characteristics based on the spread spectrum clock signal SCLK.

Figure 4A:
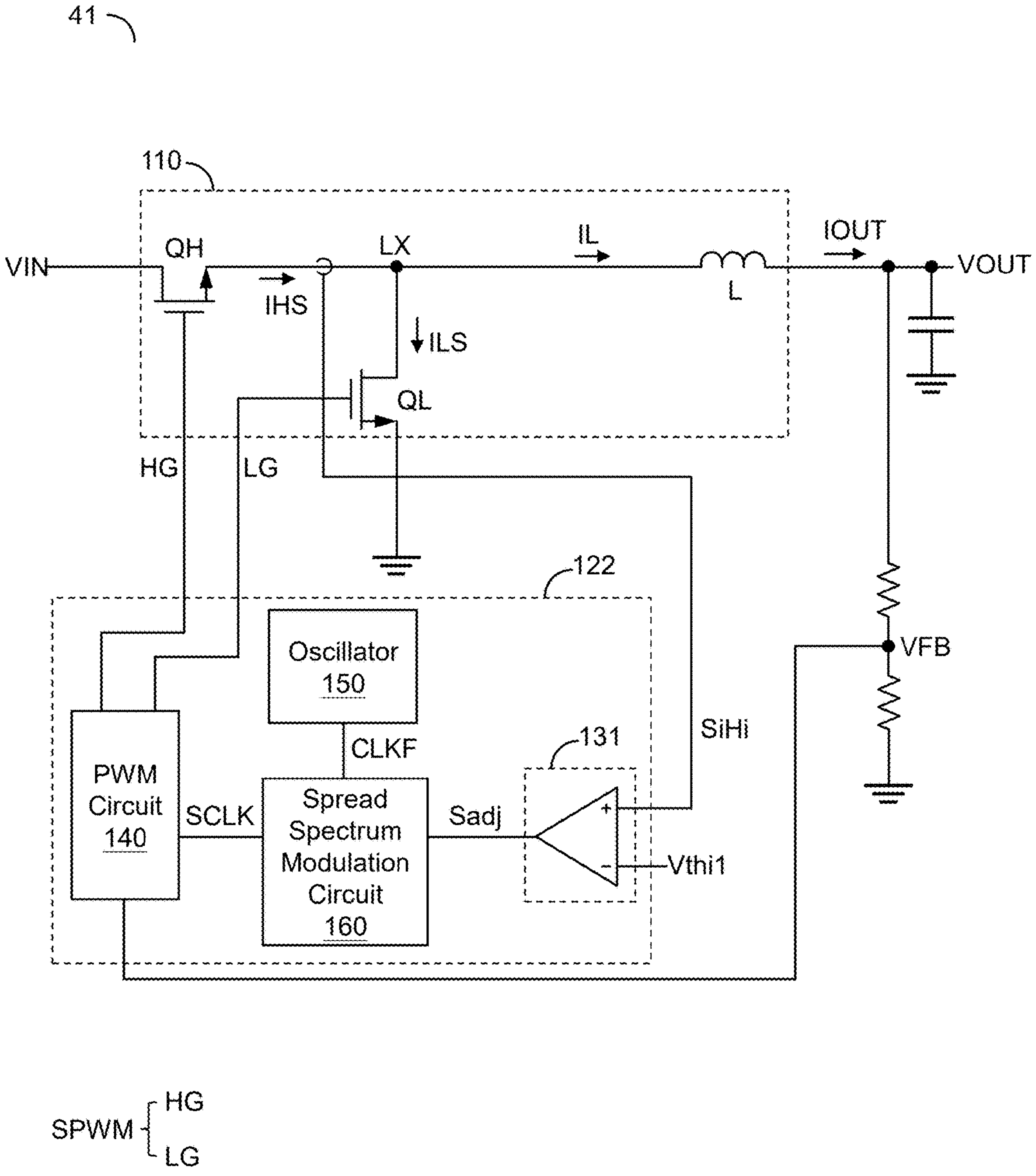
FIGS. 4A to 4C show schematic diagrams of switching power converters in various embodiments of the present invention.
Figure 4B:
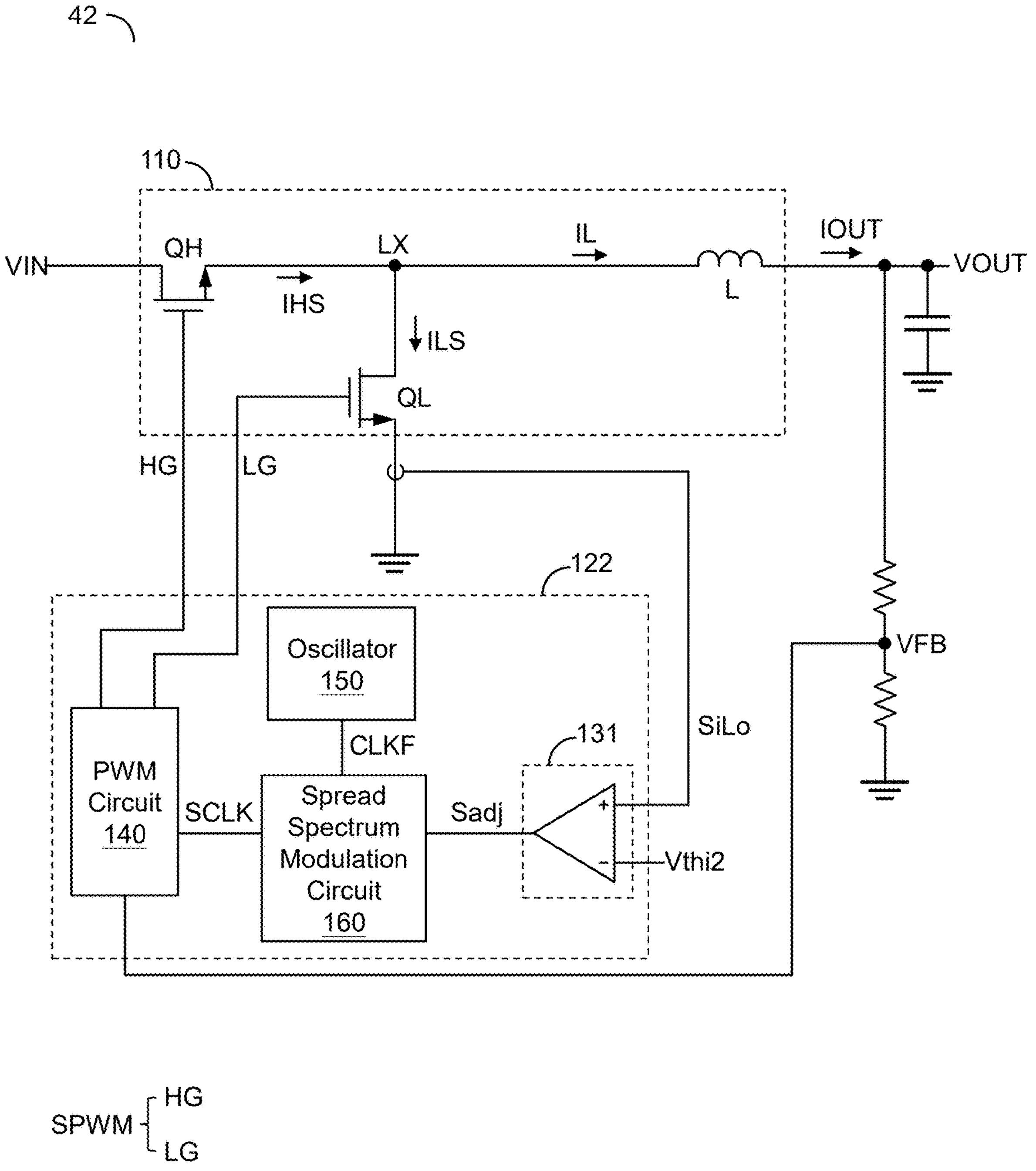
Figure 4C:
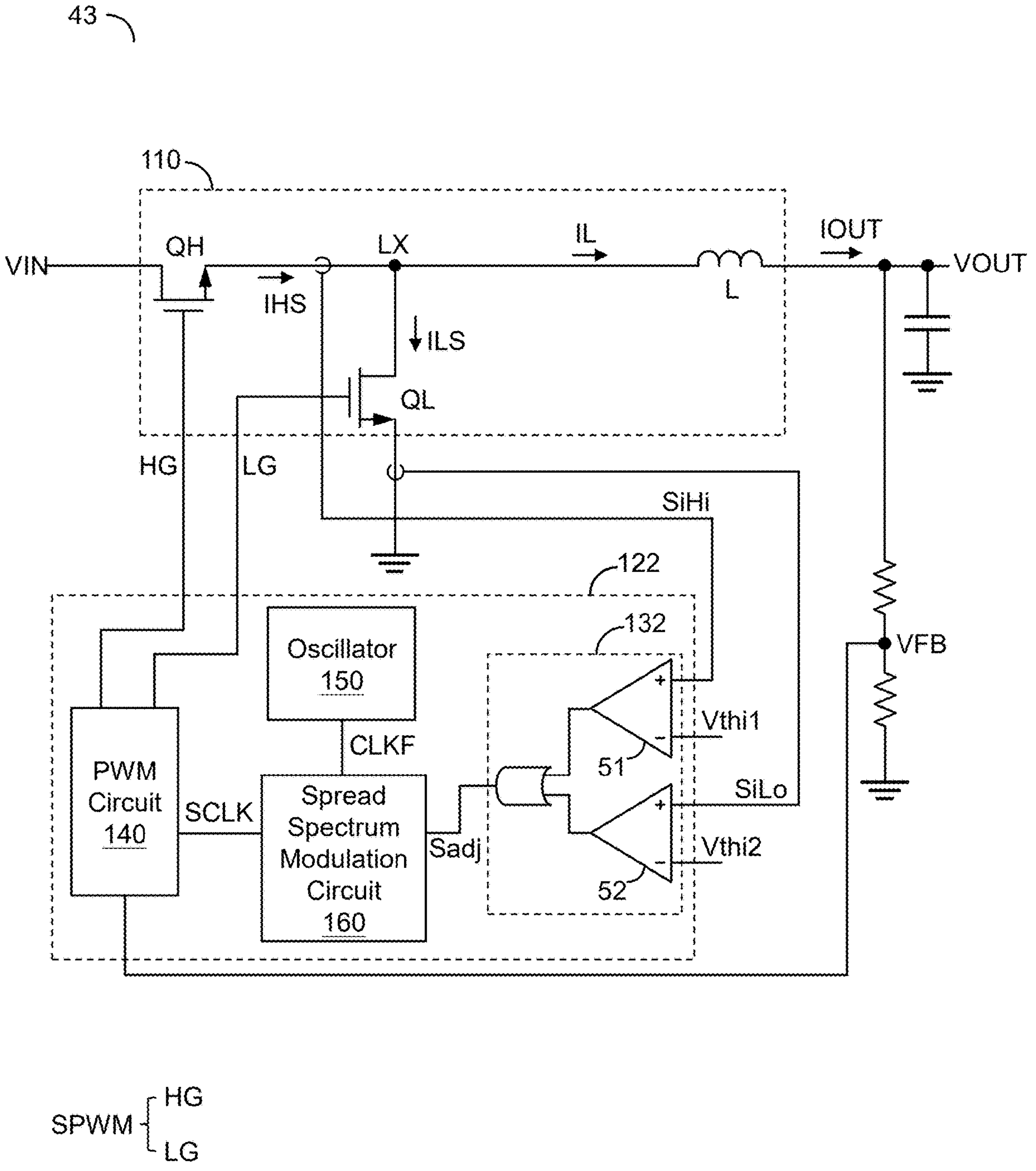

FIGS. 4A to 4C show schematic diagrams of switching power converters according to various embodiments of the present invention. The switching power converter 41 in FIG. 4A is similar to the switching power converter 30 in FIG. 3. In one embodiment, the spread spectrum adjustment circuit 131 includes a comparator, and the inductor current-related signal Sil includes a switch current-related signal SiHi, which is generated by sensing the first switch current IHS flowing through the first switch QH. In this embodiment, the comparator in the spread spectrum adjustment circuit 131 is configured to generate the spread spectrum adjustment signal Sadj based on a comparison between the switch current-related signal SiHi and a first current level threshold Vthi1.

The switching power converter 42 in FIG. 4B is similar to the switching power converter 41 in FIG. 4A. In one embodiment, as shown in FIG. 4B, the inductor current-related signal Sil includes a switch current-related signal which SiLo, is generated by sensing the second switch current ILS flowing through the second switch QL. In this embodiment, the comparator in the spread spectrum adjustment circuit 131 is configured to generate the spread spectrum adjustment signal Sadj based on a comparison between the switch current-related signal SiLo and a second current level threshold Vthi2.

The switching power converter 43 in FIG. 4C is similar to the switching power converters 41 and 42 in FIGS. 4A and 4B. In the embodiment shown in FIG. 4C, the spread spectrum adjustment circuit 132 includes comparators 51 and 52, and an OR gate 53. The comparators 51 and 52 are respectively configured to generate corresponding comparison signals based on a comparison between the switch current-related signal SiHi and the first current level threshold Vthi1, and based on a comparison between the switch current-related signal SiLo and the second current level threshold Vthi2. The OR gate 53 generates the spread spectrum adjustment signal Sadj based on the comparison results generated by comparators 51 and 52. Other operational details of FIG. 4C can be inferred from the descriptions of FIGS. 4A and 4B.

Figure 5A:
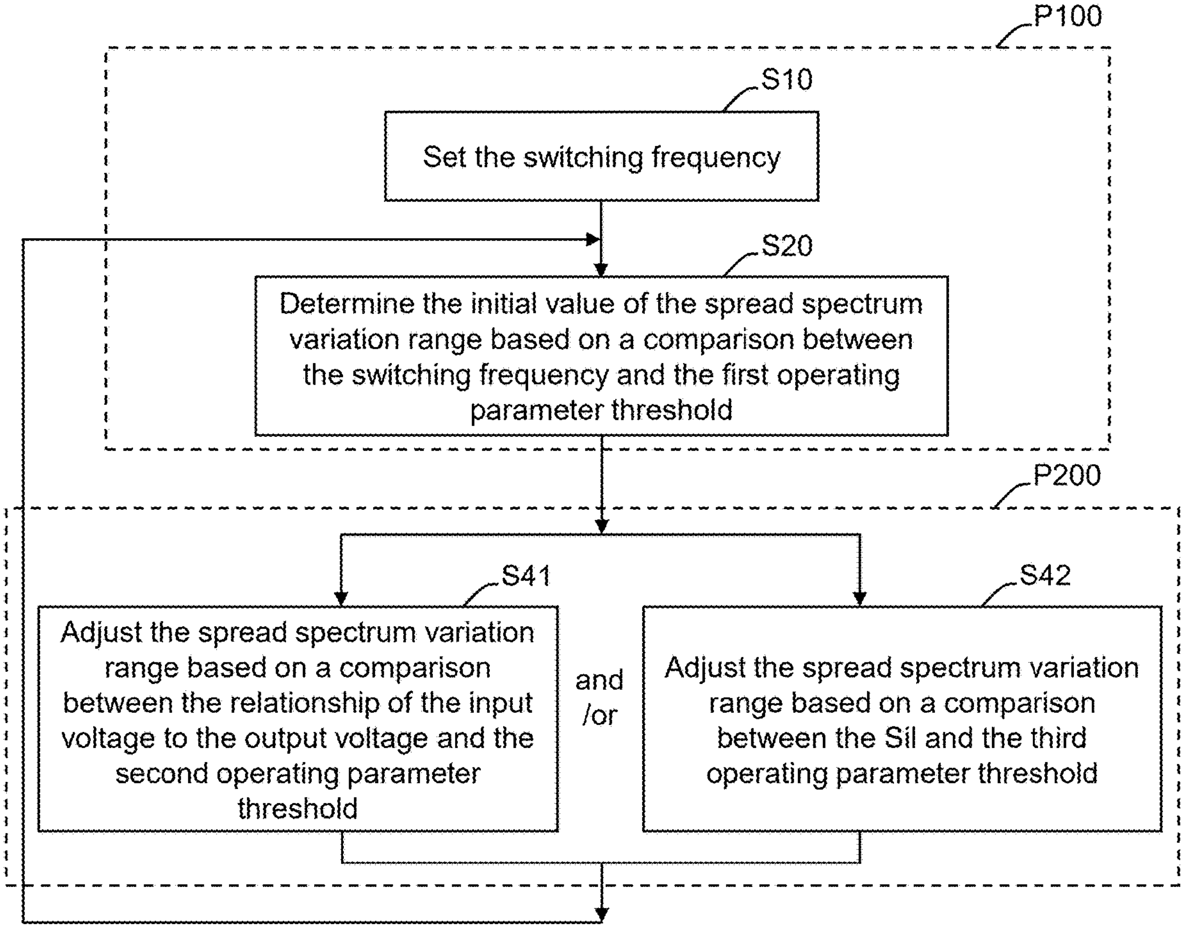
FIGS. 5A and 5B show operational flowcharts of the spread spectrum adjustment circuit in two embodiments of the present invention.
Figure 5B:
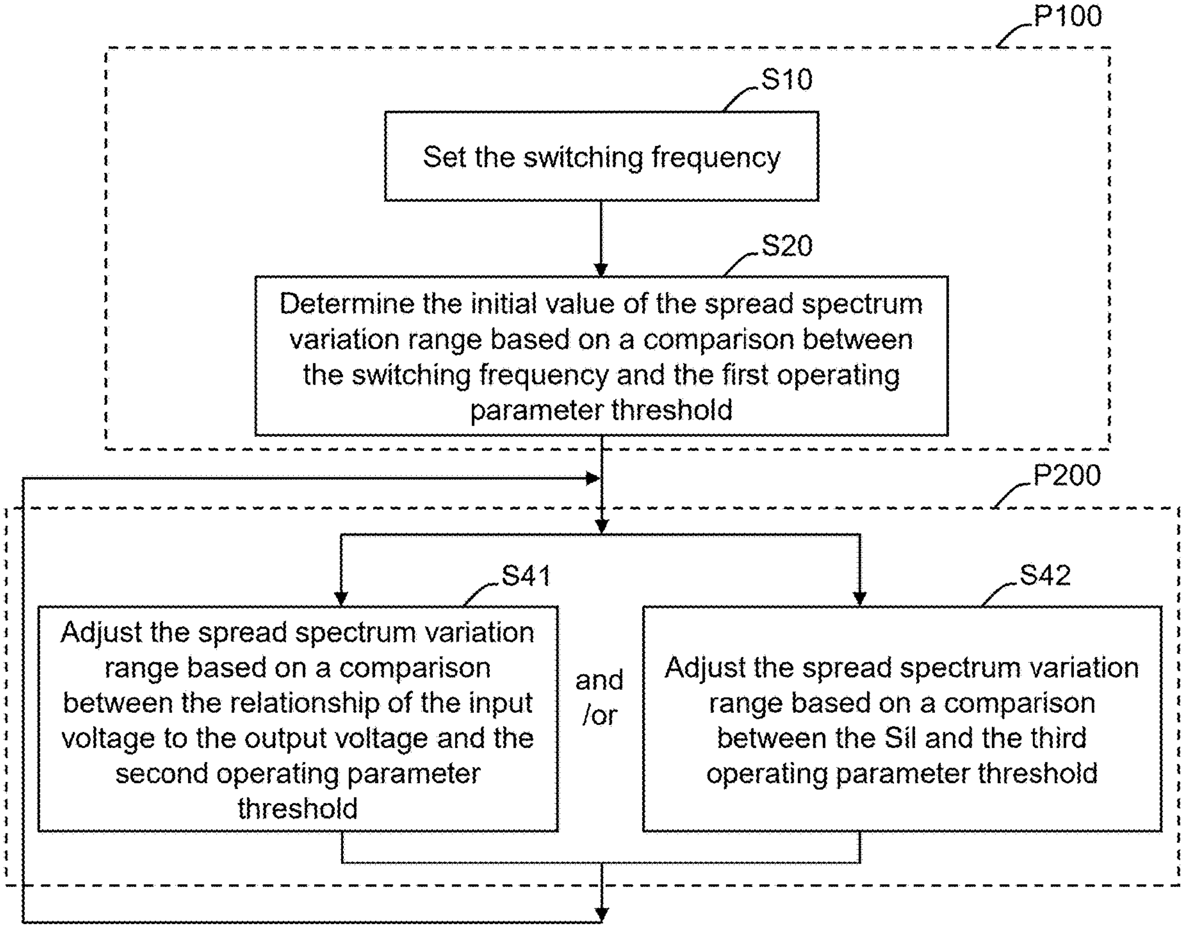

Please refer to FIGS. 2, 5A, and 5B. FIGS. 5A and 5B show operational flowcharts of the spread spectrum adjustment circuit in two embodiments of the present invention. In one embodiment, the spread spectrum adjustment circuit 130 is further configured to generate the spread spectrum adjustment signal Sadj based on a comparison between the operating parameters (including the inductor current-related signal Sil, the switching frequency Fsw, and/or the relationship between the input voltage VIN and the output voltage VOUT) and at least one threshold, thereby adjusting the spread spectrum adjustment parameter (such as the spread spectrum variation range Δf). The operation flow of the spread spectrum adjustment circuit 130 for adjusting the spread spectrum adjustment parameter is described below.

In one embodiment, in the procedure P100, the spread spectrum adjustment circuit 130 firstly configures the switching frequency Fsw in step S10. It should be noted that the switching frequency Fsw can be a fixed or variable value. In one embodiment, the switching frequency Fsw may be a base frequency without spread spectrum characteristics. Then, in step S20, the initial value of the spread spectrum variation range Δf is determined based on a comparison between the switching frequency Fsw and a first operating parameter threshold. After completing step S20 in procedure P100, the process proceeds to steps S41 and/or S42 in adjustment procedure P200. In step S41, the spread spectrum variation range Δf is adjusted based on a comparison between the relationship of the input voltage VIN to the output voltage VOUT and a second operating parameter threshold. In step S42, the spread spectrum variation range Δf is adjusted based on a comparison between the inductor current-related signal Sil and a third operating parameter threshold.

After completing steps S41 and/or S42, in one embodiment, as shown in FIG. 5A, the process returns to step S20 in procedure P100; in another embodiment, as shown in FIG. 5B, the process returns to adjustment procedure P200.

Figure 6A:
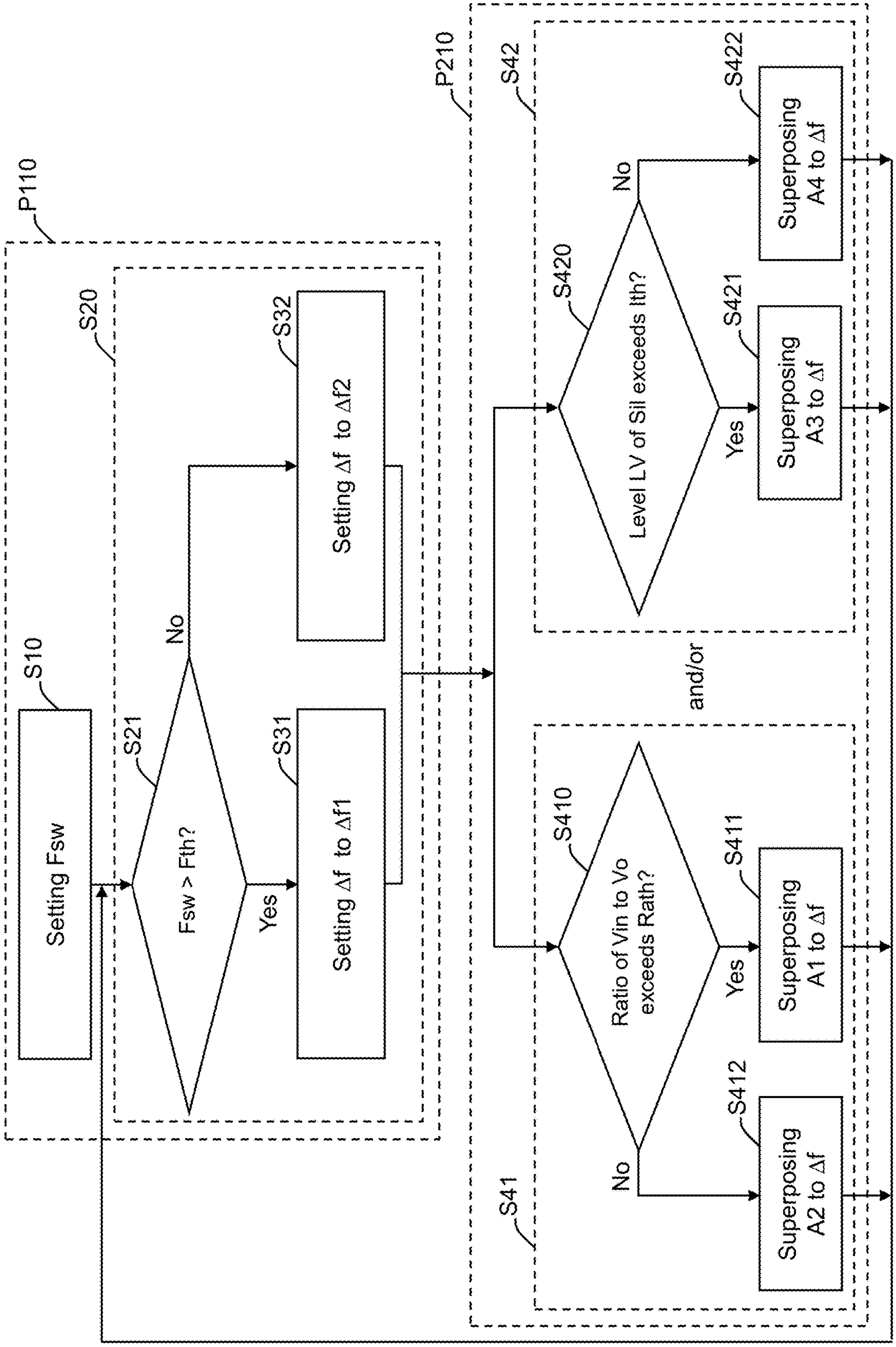
FIGS. 6A and 6B show operational flowcharts of the spread spectrum adjustment circuit in two specific embodiments of the present invention.
Figure 6B:
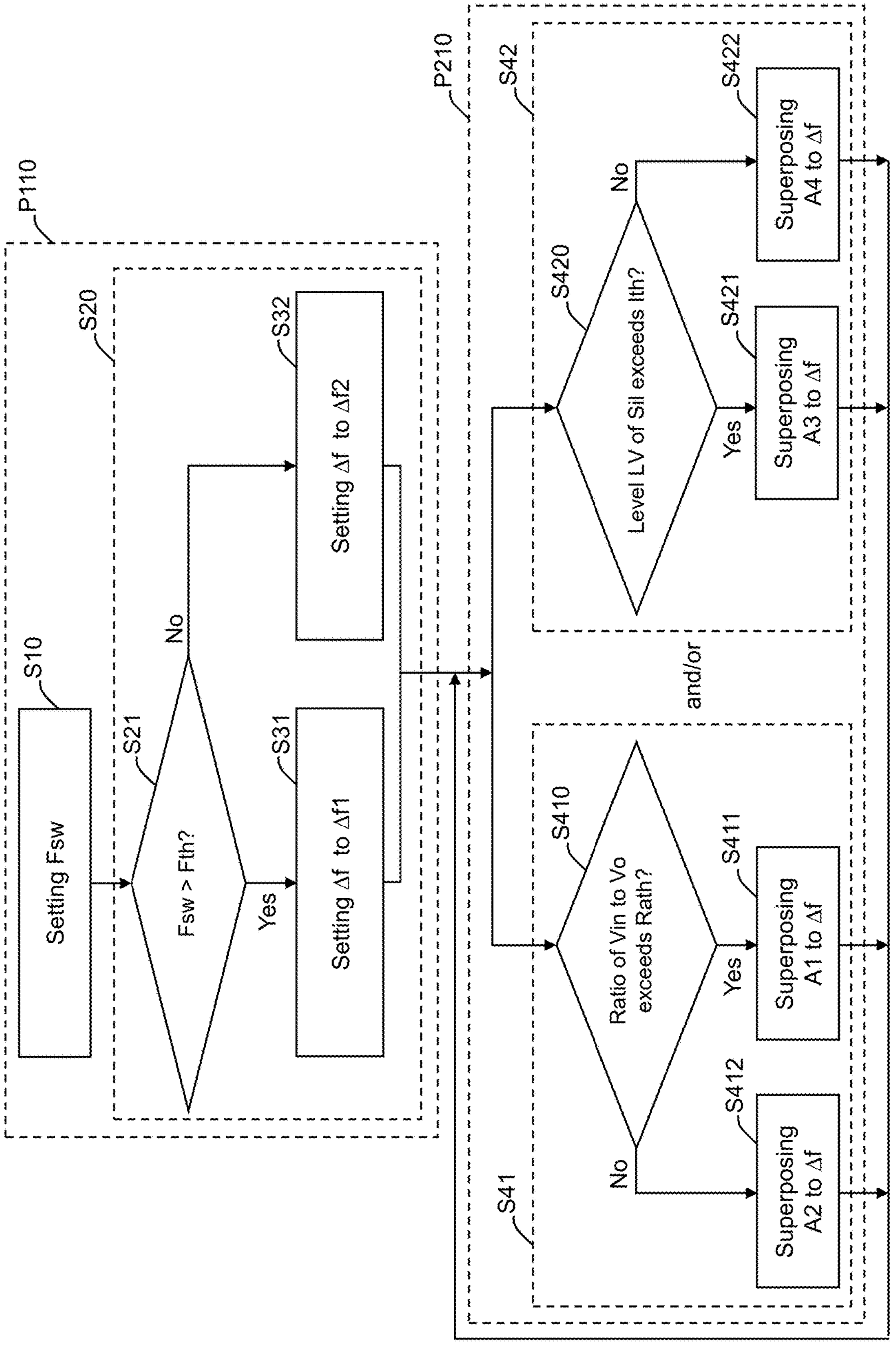

FIGS. 6A and 6B show operational flowcharts of the spread spectrum adjustment circuit in two specific embodiments of the present invention. Procedures P110 and adjustment procedure P210 in FIGS. 6A and 6B correspond respectively to procedures P100 and adjustment procedure P200 in FIGS. 5A and 5B. In one specific embodiment, in procedure P110, after completing step S10, the process proceeds to decision step S21, where the initial value of the spread spectrum variation range Δf is determined based on a comparison between the switching frequency Fsw and the frequency threshold Fth. When the switching frequency Fsw is greater than the frequency threshold Fth (corresponding to the aforementioned first operating parameter threshold), the process proceeds to step S31, where the spread spectrum variation range Δf is set to the first initial value Δf1; otherwise, the process proceeds to step S32, where the spread spectrum variation range Δf is set to the second initial value Δf2. In adjustment procedure P210 in FIG. 6A or FIG. 6B, step S41 includes decision step S410, step S411, and step S412, and step S42 includes decision step S420, step S421, and step S422. In one embodiment, after completing step S31 or step S32, the process proceeds to steps S41 and/or S42 in adjustment procedure P210. In one specific embodiment, the frequency threshold Fth is, for example, 1 MHz. In one specific embodiment, the first initial value Δf1 is greater than the second initial value Δf2; for example, the first initial value Δf1 is 6%, and the second initial value Δf2 is 3%.

In one embodiment, as shown in FIG. 6A or FIG. 6B, in step S41 of adjustment procedure P210, the process first enters decision step S410, where the spread spectrum variation range Δf is adjusted based on a comparison between the ratio of the input voltage VIN to the output voltage VOUT and the ratio threshold Rath (corresponding to the aforementioned second operating parameter threshold). When the ratio of the input voltage VIN to the output voltage VOUT exceeds the ratio threshold Rath, the process proceeds to step S411, where the spread spectrum variation range Δf is added with the first adjustment value A1; otherwise, the process proceeds to step S412, where the spread spectrum variation range Δf is added with the second adjustment value A2. In step S42, the process first enters decision step S420, where the spread spectrum variation range Δf is adjusted based on a comparison between the level LV of the inductor current-related signal Sil and the current level threshold Ith (corresponding to the aforementioned third operating parameter threshold). When the level LV of the inductor current-related signal Sil exceeds the current level threshold Ith, the process proceeds to step S421, where the spread spectrum variation range Δf is added with the third adjustment value A3; otherwise, the process proceeds to step S422, where the spread spectrum variation range Δf is added with the fourth adjustment value A4. In one specific embodiment, the first adjustment value A1 is greater than the second adjustment value A2, and the third adjustment value A3 is greater than the fourth adjustment value A4.

After completing steps S411 and S412 and/or steps S421 and S422, in one embodiment, as shown in FIG. 6A, the process returns to step S20 in procedure P110; in another embodiment, as shown in FIG. 6B, the process returns to adjustment procedure P210.

It should be noted that when the power stage circuit in the switching power converter of the present invention is configured as a buck power stage circuit (as shown in FIG. 2), in the aforementioned decision step S410, if the ratio of the input voltage VIN to the output voltage VOUT exceeds the ratio threshold Rath, this may indicate, from one perspective, that the duty cycle of the PWM signal SPWM is lower than a low duty cycle threshold, or from another perspective, that the duty cycle of the PWM signal SPWM is higher than a high duty cycle threshold. In other words, when the duty cycle of the power stage circuit is too low or too high (for example, when the voltage difference or ratio between the input voltage VIN and the output voltage VOUT is too large, or when the output load is excessively high), the electromagnetic interference (EMI) of the switching power converter is relatively high. In this situation, the present invention adds a larger adjustment value to the spread spectrum variation range Δf in step S411 to reduce EMI; conversely, when the duty cycle of the power stage circuit is not too low or too high, the present invention adds a smaller adjustment value (or no adjustment) to the spread spectrum variation range Δf in step S412 to adaptively adjust the spread spectrum variation range, thereby reducing unnecessary power loss and mitigating ripple in the output voltage and current. From another perspective, if the ratio of the input voltage VIN to the output voltage VOUT exceeds the ratio threshold Rath, it may also indicate that the rate of change ΔIL of the inductor current IL exceeds the rate of change threshold ΔILth, indicating a high rise or fall slope of the inductor current IL, which can similarly cause higher EMI.

It should also be noted that when the level LV of the inductor current-related signal Sil exceeds the current level threshold Ith, this indicates that the level LV of the inductor current-related signal exceeds the power level threshold LVth, and in this case, the EMI of the switching power converter is relatively high. Therefore, the present invention can also adaptively adjust the spread spectrum variation range based on the inductor current-related signal Sil, as inferred from the descriptions above.

Figure 6C:
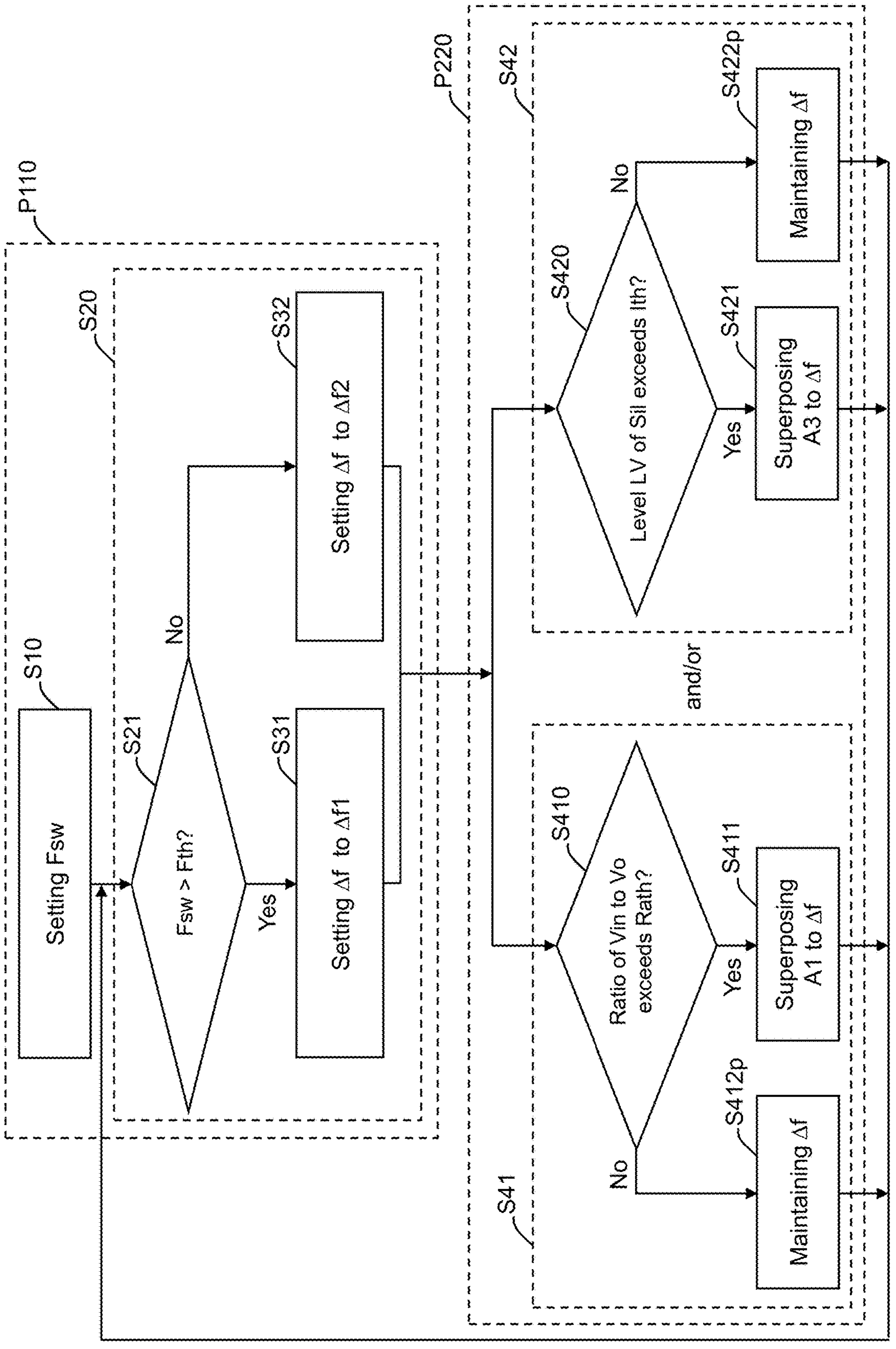
FIGS. 6C and 6D show operational flowcharts of the spread spectrum adjustment circuit in two additional specific embodiments of the present invention.
Figure 6D:
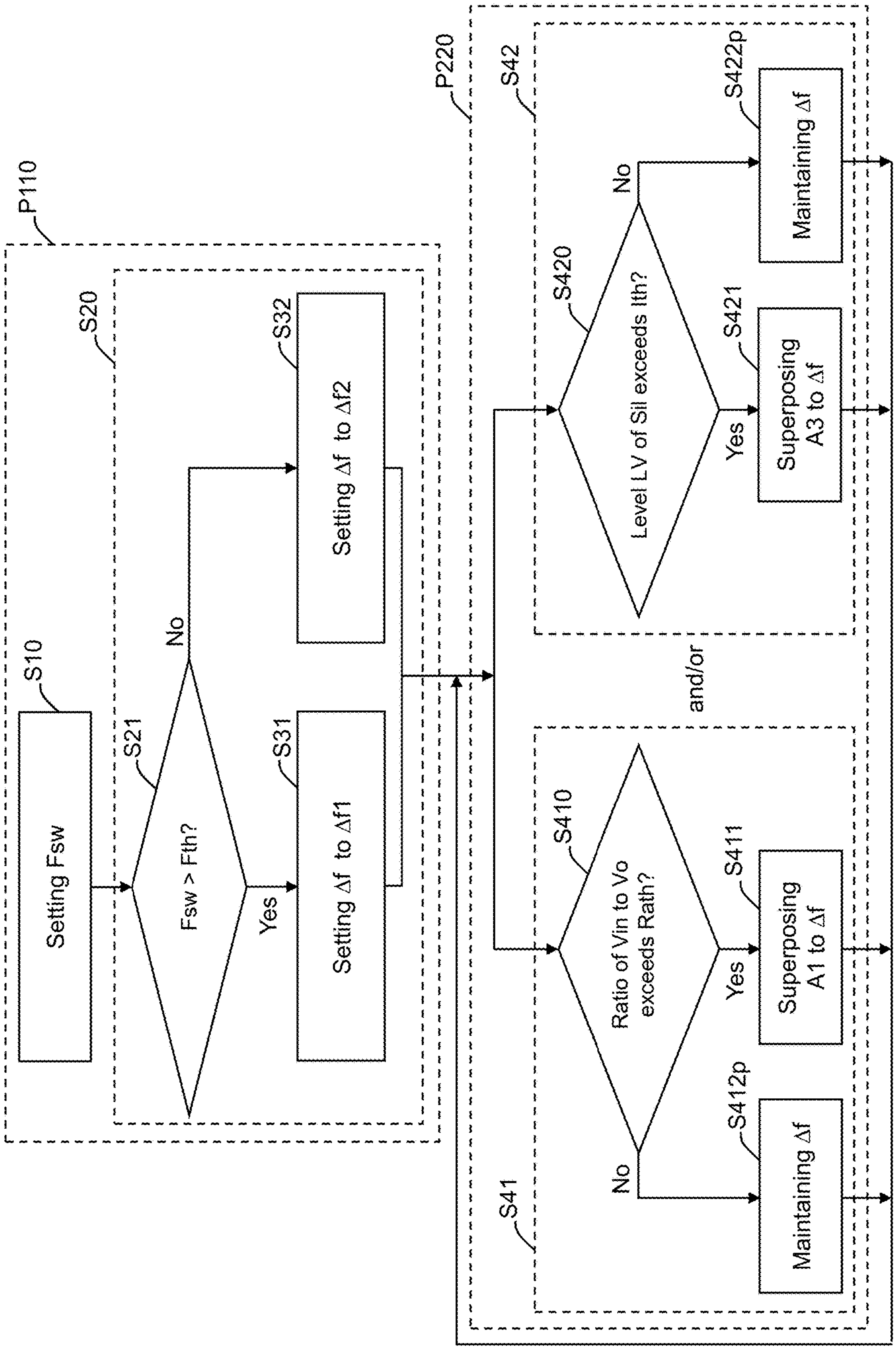

FIGS. 6C and 6D show operational flowcharts of the spread spectrum adjustment circuit in two additional specific embodiments of the present invention. The flowcharts in FIGS. 6C and 6D respectively correspond to the specific embodiments in FIGS. 6A and 6B. In one specific embodiment, the first adjustment value A1 is, for example, a 3% adjustment value. In one specific embodiment, as shown in FIG. 6C, the second adjustment value A2 in step S412*p* of adjustment procedure P220 is, for example, 0 to maintain the spread spectrum variation range Δf. In one specific embodiment, as shown in FIG. 6D, the fourth adjustment value A4 in step S422*p* of adjustment procedure P220 is also, for example, 0 to maintain the spread spectrum variation range Δf. In one embodiment, the first adjustment value A1 is equal to the third adjustment value A3. Other details not described can be inferred from the descriptions of FIGS. 6A and 6B.

Figure 7:
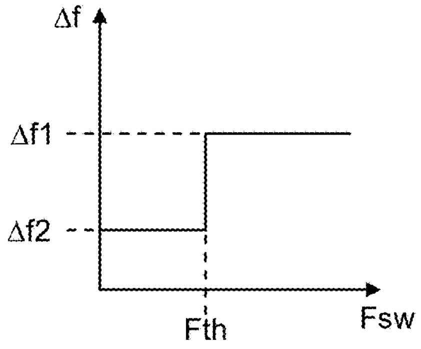
FIG. 7 shows a characteristic diagram between the spread spectrum variation range and the switching frequency in an embodiment of the present invention.

FIG. 7 shows a characteristic diagram between the spread spectrum variation range and the switching frequency in an embodiment of the present invention. As shown in FIG. 7, in one embodiment, when the switching frequency Fsw is greater than the frequency threshold Fth, the spread spectrum variation range Δf is set to the first initial value Δf1; otherwise, it is set to the second initial value Δf2. In this embodiment, the first initial value Δf1 is greater than the second initial value Δf2.

Figure 8A:
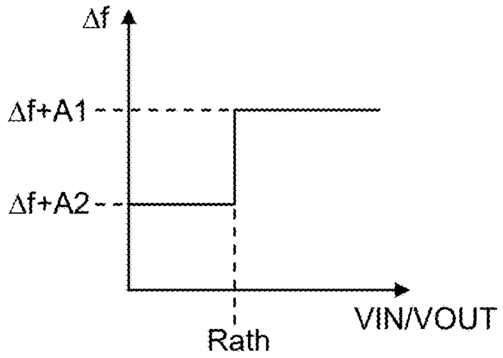
FIGS. 8A and 8B show characteristic diagrams between the spread spectrum variation range and the ratio of the input voltage to the output voltage in an embodiment of the present invention.
Figure 8B:
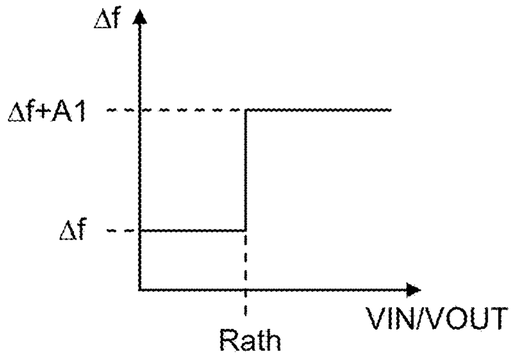

FIGS. 8A and 8B show characteristic diagrams between the spread spectrum variation range and the ratio of the input voltage to the output voltage in an embodiment of the present invention. Referring to FIG. 6A or 6B, in one embodiment, as shown in FIG. 8A, when the ratio of the input voltage VIN to the output voltage VOUT exceeds the ratio threshold Rath, the spread spectrum variation range Δf (first initial value Δf1 or second initial value Δf2) is added with the first adjustment value A1; otherwise, it is added with the second adjustment value A2. Referring to FIG. 6C or 6D, in one embodiment as shown in FIG. 8B, when the ratio of the input voltage VIN to the output voltage VOUT exceeds the ratio threshold Rath, the spread spectrum variation range Δf (first initial value Δf1 or second initial value Δf2) is added with the first adjustment value A1; otherwise, the spread spectrum variation range Δf is maintained.

Figure 9A:
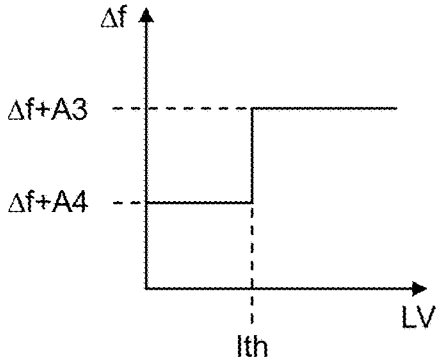
FIGS. 9A and 9B show characteristic diagrams between the spread spectrum variation range and the level of the inductor current-related signal in an embodiment of the present invention.
Figure 9B:
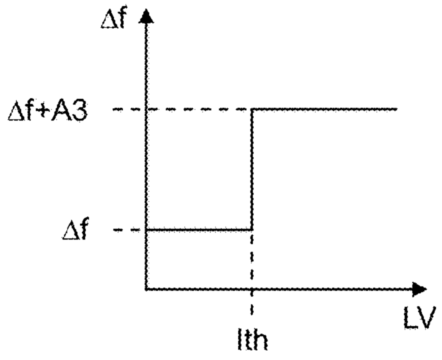
Figure 10A:
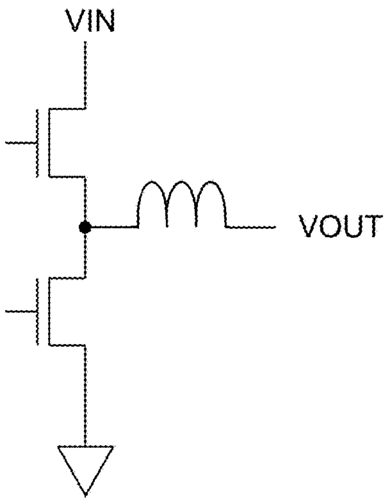
FIGS. 10A to 10K show various embodiments of the power stage circuit in the switching converter according to the present invention.
Figure 10B:
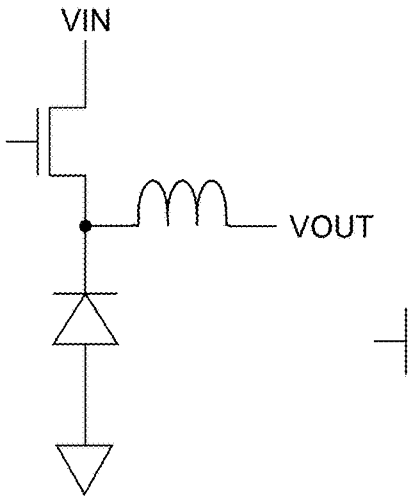
Figure 10C:
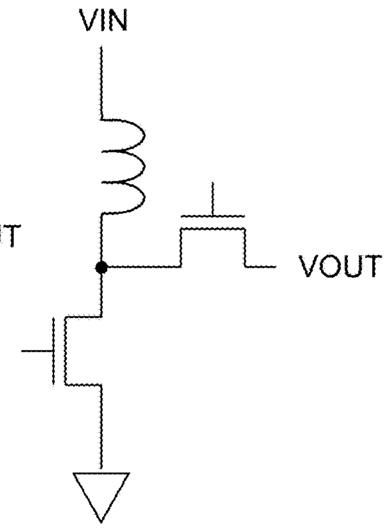
Figure 10D:
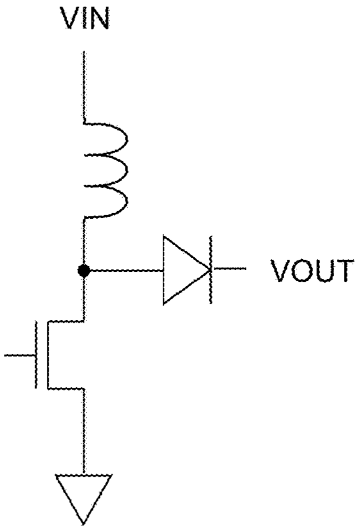
Figure 10E:
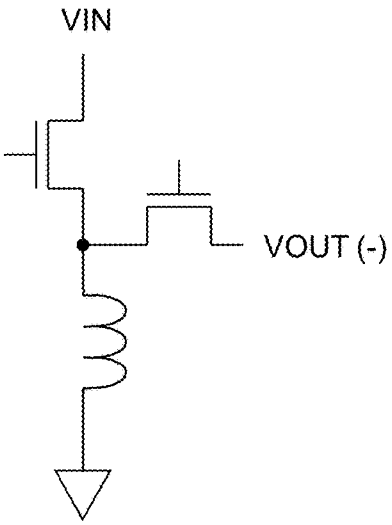
Figure 10F:
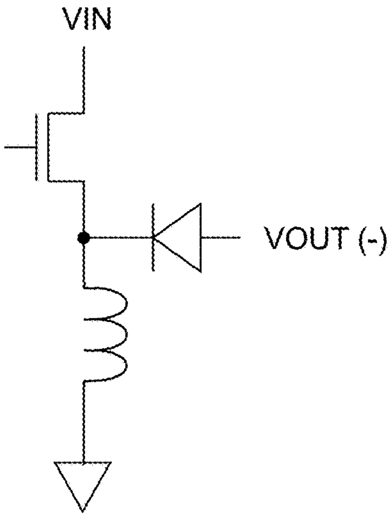
Figure 10G:
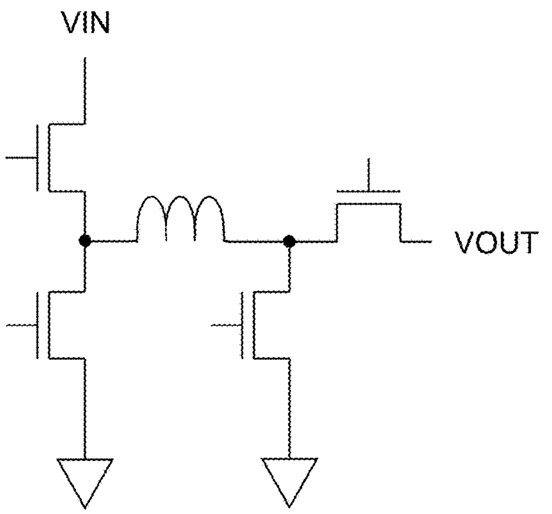
Figure 10H:
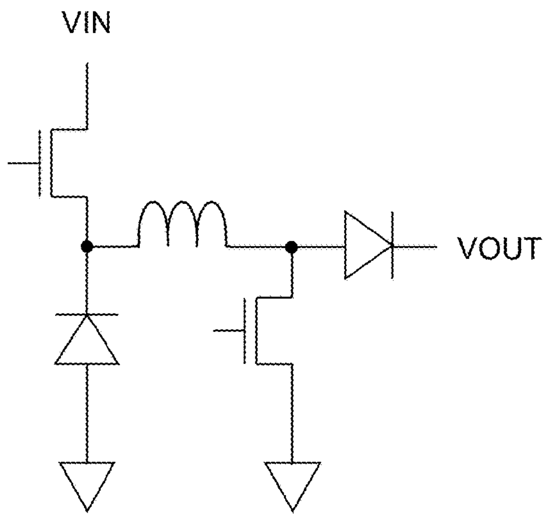
Figure 10I:
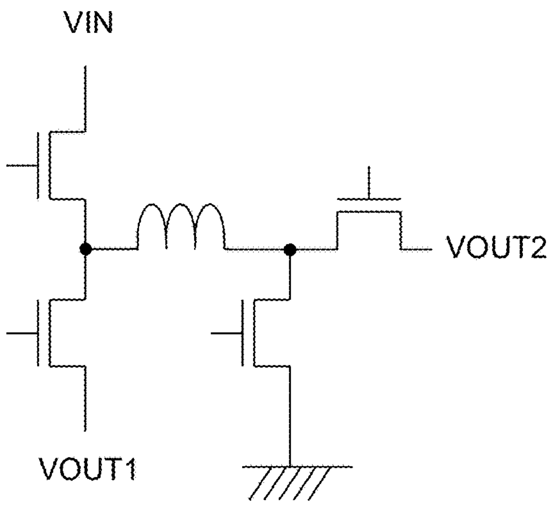
Figure 10J:
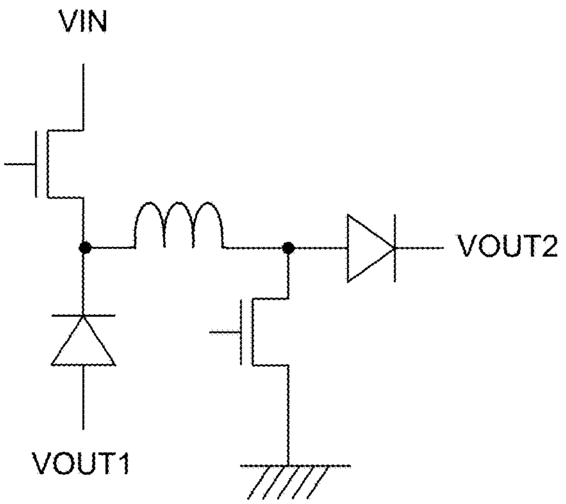
Figure 10K:
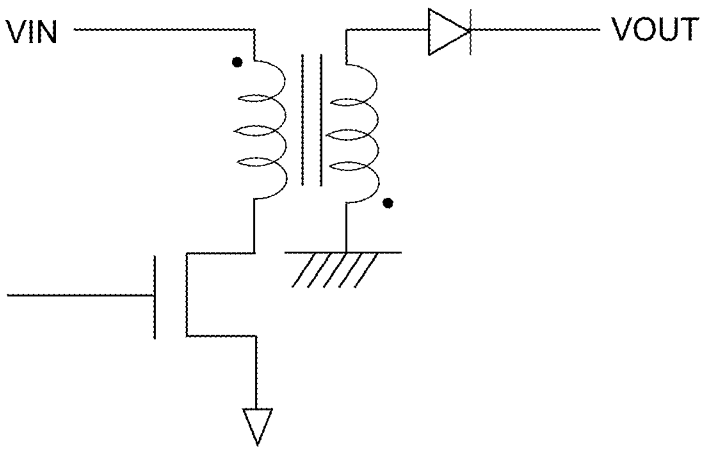

FIGS. 9A and 9B show characteristic diagrams between the spread spectrum variation range and the level of the inductor current-related signal in an embodiment of the present invention. Referring to FIG. 6A or 6B, in one embodiment, as shown in FIG. 9A, when the level LV of the inductor current-related signal Sil exceeds the current level threshold Ith, the spread spectrum variation range Δf (first initial value Δf1 or second initial value Δf2) is added with the third adjustment value A3; otherwise, it is added with the fourth adjustment value A4. Referring to FIG. 6C or 6D, in one embodiment, as shown in FIG. 9B, when the level LV of the inductor current-related signal Sil exceeds the current level threshold Ith, the spread spectrum variation range Δf (first initial value Δf1 or second initial value Δf2) is added with the third adjustment value A3; otherwise, the spread spectrum variation range Δf is maintained.

FIGS. 10A to 10K show various embodiments of the power stage circuit in the switching converter according to the present invention. As shown in FIGS. 10A to 10K, in other embodiments, the power stage circuits 110 in FIGS. 2, 3, and 4A-4C can be, for example but not limited to, a boost converter, a buck converter, a buck-boost converter, or a flyback converter.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be configured together, or, a part of one embodiment can be configured to replace a corresponding part of another embodiment. In view of the foregoing, the spirit of the present invention should cover all such and other modifications and variations, which should be interpreted to fall within the scope of the following claims and their equivalents.

What is claimed is:

1. A spread spectrum control circuit, for generating a pulse-width modulation (PWM) signal switched at a switching frequency to control a switching power converter, wherein the switching power converter includes a power stage circuit, the power stage circuit includes an inductor and at least one power switch coupled to each other, and is configured to switch the at least one power switch according to the PWM signal to convert an input voltage to generate an output voltage; the spread spectrum control circuit comprising:

a spread spectrum adjustment circuit, configured to generate a spread spectrum adjustment signal based on a comparison between an operating parameter of the switching power converter and at least one threshold, thereby controlling the switching frequency exhibiting a spread spectrum characteristic; and a PWM circuit, configured to adaptively adjust a spread spectrum variation range of the switching frequency based on the spread spectrum adjustment signal, so that the spread spectrum variation range is adaptively adjusted with changes in the operating parameter, thereby generating the PWM signal exhibiting the spread spectrum characteristic;

wherein the operating parameter includes an inductor current-related signal, the switching frequency, and/or a relationship between the input voltage and the output voltage, wherein the inductor current-related signal is related to an inductor current flowing through the inductor;

wherein an operation of the spread spectrum adjustment circuit includes:

determining an initial value of the spread spectrum variation range based on a comparison between the switching frequency and a first operating parameter threshold; and performing the following:

adjusting the spread spectrum variation range based on a comparison between the relationship of the input voltage to the output voltage and a second operating parameter threshold; and/or adjusting the spread spectrum variation range based on a comparison between the inductor current-related signal and a third operating parameter threshold.

2. The spread spectrum control circuit of claim 1, further comprising:

an oscillator, configured to generate a base clock signal; and a spread spectrum modulation circuit, configured to generate a spread spectrum clock signal exhibiting the spread spectrum characteristic based on the base clock signal and the spread spectrum adjustment signal;

wherein the PWM circuit is further configured to generate the PWM signal exhibiting the spread spectrum characteristic based on the spread spectrum clock signal.

3. The spread spectrum control circuit of claim 1, wherein the at least one power switch includes a first switch and a second switch, wherein the inductor current-related signal includes a first switch current flowing through the first switch and/or a second switch current flowing through the second switch.

4. The spread spectrum control circuit of claim 1, wherein the relationship between the input voltage and the output voltage includes at least one of the following:

a ratio of the input voltage to the output voltage; or a ratio of the output voltage to the input voltage.

5. The spread spectrum control circuit of claim 1, wherein the spread spectrum variation range is positively correlated with the inductor current-related signal, the switching frequency, and/or the relationship between the input voltage and the output voltage.

6. The spread spectrum control circuit of claim 5, wherein the power stage circuit is configured as a buck power stage circuit, wherein the spread spectrum variation range is positively correlated with a ratio of the input voltage to the output voltage.

7. The spread spectrum control circuit of claim 1, wherein the operation of the spread spectrum adjustment circuit further includes:

setting the spread spectrum variation range to a first initial value when the switching frequency is greater than a frequency threshold, and otherwise setting the spread spectrum variation range to a second initial value, the first initial value being greater than the second initial value; and performing the following:

adding a first adjustment value to the spread spectrum variation range when a ratio of the input voltage to the output voltage exceeds a ratio threshold, and otherwise adding a second adjustment value to the spread spectrum variation range, the first adjustment value being greater than the second adjustment value; and/or adding a third adjustment value to the spread spectrum variation range when a level of the inductor current-related signal exceeds a current level threshold, and otherwise adding a fourth adjustment value to the spread spectrum variation range, the third adjustment value being greater than the fourth adjustment value.

8. The spread spectrum control circuit of claim 7, wherein the first adjustment value is equal to the third adjustment value, the second adjustment value is 0 to maintain the spread spectrum variation range, and/or the fourth adjustment value is 0 to maintain the spread spectrum variation range.

9. A spread spectrum control method, for generating a pulse-width modulation (PWM) signal switched at a switching frequency to control a switching power converter, wherein the switching power converter includes a power stage circuit, the power stage circuit includes an inductor and at least one power switch coupled to each other, and is configured to switch the at least one power switch according to the PWM signal to convert an input voltage to generate an output voltage; the spread spectrum control method comprising:

obtaining an operating parameter of the switching power converter;

generating a spread spectrum adjustment signal based on a comparison between the operating parameter and at least one threshold, thereby controlling the switching frequency exhibiting a spread spectrum characteristic; and adaptively adjusting a spread spectrum variation range of the switching frequency based on the spread spectrum adjustment signal, so that the spread spectrum variation range is adaptively adjusted with changes in the operating parameter, thereby generating the PWM signal exhibiting the spread spectrum characteristic;

wherein the operating parameter includes an inductor current-related signal, the switching frequency, and/or a relationship between the input voltage and the output voltage, wherein the inductor current-related signal is related to an inductor current flowing through the inductor;

wherein the step of adaptively adjusting the spread spectrum variation range includes:

determining an initial value of the spread spectrum variation range based on a comparison between the switching frequency and a first operating parameter threshold; and performing the following:

adjusting the spread spectrum variation range based on a comparison between the relationship of the input voltage to the output voltage and a second operating parameter threshold; and/or adjusting the spread spectrum variation range based on a comparison between the inductor current-related signal and a third operating parameter threshold.

10. The spread spectrum control method of claim 9, further comprising:

generating a base clock signal; and generating a spread spectrum clock signal exhibiting the spread spectrum characteristic based on the base clock signal and the spread spectrum adjustment signal;

wherein the step of generating the PWM signal exhibiting the spread spectrum characteristic includes:

generating the PWM signal exhibiting the spread spectrum characteristic based on the spread spectrum clock signal.

11. The spread spectrum control method of claim 9, wherein the at least one power switch includes a first switch and a second switch, wherein the inductor current-related signal includes a first switch current flowing through the first switch and/or a second switch current flowing through the second switch.

12. The spread spectrum control method of claim 9, wherein the relationship between the input voltage and the output voltage includes at least one of the following:

a ratio of the input voltage to the output voltage; or a ratio of the output voltage to the input voltage.

13. The spread spectrum control method of claim 9, wherein the spread spectrum variation range is positively correlated with the inductor current-related signal, the switching frequency, and/or the relationship between the input voltage and the output voltage.

14. The spread spectrum control method of claim 13, wherein the power stage circuit is configured as a buck power stage circuit, wherein the spread spectrum variation range is positively correlated with a ratio of the input voltage to the output voltage.

15. The spread spectrum control method of claim 9, wherein the step of adaptively adjusting the spread spectrum variation range further includes:

setting the spread spectrum variation range to a first initial value when the switching frequency is greater than a frequency threshold, and otherwise setting the spread spectrum variation range to a second initial value, the first initial value being greater than the second initial value; and performing the following:

adding a first adjustment value to the spread spectrum variation range when a ratio of the input voltage to the output voltage exceeds a ratio threshold, and otherwise adding a second adjustment value to the spread spectrum variation range, the first adjustment value being greater than the second adjustment value; and/or adding a third adjustment value to the spread spectrum variation range when a level of the inductor current-related signal exceeds a current level threshold, and otherwise adding a fourth adjustment value to the spread spectrum variation range, the third adjustment value being greater than the fourth adjustment value.

16. The spread spectrum control method of claim 15, wherein the first adjustment value is equal to the third adjustment value, the second adjustment value is 0 to maintain the spread spectrum variation range, and/or the fourth adjustment value is 0 to maintain the spread spectrum variation range.

* * * * *